United States Patent [19]

Koyanagi et al.

[11] 4,151,607
[45] Apr. 24, 1979

[54] SEMICONDUCTOR MEMORY DEVICE

[75] Inventors: Mitsumasa Koyanagi; Kikuji Sato, both of Kokubunji, Japan

[73] Assignee: Hitachi, Ltd., Japan

[21] Appl. No.: 812,907

[22] Filed: Jul. 5, 1977

[30] Foreign Application Priority Data

Jul. 5, 1976 [JP] Japan .................................. 51/78967
Mar. 4, 1977 [JP] Japan .................................. 52/22685

[51] Int. Cl.² ............................................. G11C 11/40
[52] U.S. Cl. ..................................... 365/174; 365/184; 307/238
[58] Field of Search ..... 340/173 R, 173 CA, 173 FF; 307/238; 365/174, 184

[56] References Cited
U.S. PATENT DOCUMENTS

3,849,767 11/1974 Shirato .......................... 340/173 CA
3,855,610 12/1974 Masuda .......................... 340/173 CA

*Primary Examiner*—Terrell W. Fears
*Attorney, Agent, or Firm*—Craig & Antonelli

[57] ABSTRACT

A semiconductor memory device consisting of a storage capacitance and an insulated gate field-effect transistor, wherein over a first conductive substance which lies in contact with a source of drain region constituting the transistor and which becomes a gate of the transistor through a first insulating film, a second conductive substance is deposited so that at least a part thereof may be stacked over the first conductive substance, and wherein a second insulating film and a third conductive substance are successively deposited on the second conductive substance, whereby the second conductive substance, the second insulating film and the third conductive substance constitute the storge capacitance.

3 Claims, 15 Drawing Figures

SEMICONDUCTOR MEMORY DEVICE

BACKGROUND OF THE INVENTION

1. Field of the Invention

This invention relates to a semiconductor memory device which is highly integrated.

2. Description of the Prior Art

An integrated semiconductor memory device has been known from, for example, U.S. Pat. No. 3,387,286. The memory cell is composed of diffused layers formed in a substrate, an isolation oxide which isolates differents elements from each other, as well as a gate oxide film formed in contact therewith, an electrode for forming a storage capacitance as made of polycrystalline silicon, a gate similarly made of polycrystalline silicon, an insulating film covering the electrode and the gate, and a metal electrode serving as a word line. Among these components, the gate electrode, the gate oxide film and the diffused layers constitute a switching transistor, while the storage capacitance forming electrode, the gate oxide film and a part of the diffused layer constitute the storage capacitance. The switching transistor and the storage capacitance are two-dimensionally so arranged on one plane that they don't overlap each other. The prior art accordingly has the disadvantage that the area of the memory cell becomes large.

SUMMARY OF THE INVENTION

It is therefore an object of this invention to provide a semiconductor memory device which has a large storage capacitance and whose memory cell area per bit is small.

In order to accomplish the object, in a semiconductor memory device according to this invention, a conductive substance is deposited in contact with a source or drain region, an insulating film and another conductive substance are successively deposited on the conductive substance, and the conductive substances and the insulating film constitute a capacitance for storing an information.

Since the storage capacitance is three-dimensionally stacked on a switching transistor, the memory cell area per bit can be remarkably reduced.

While this invention will now be described more in detail on embodiments with reference to the accompanying drawing, the embodiments are for elucidation only, and various modifications and improvements can of course be made without departing from the spirit of this invention.

DESCRIPTION OF THE PREFERRED EMBODIMENTS

EXAMPLE 1

Figure 1:
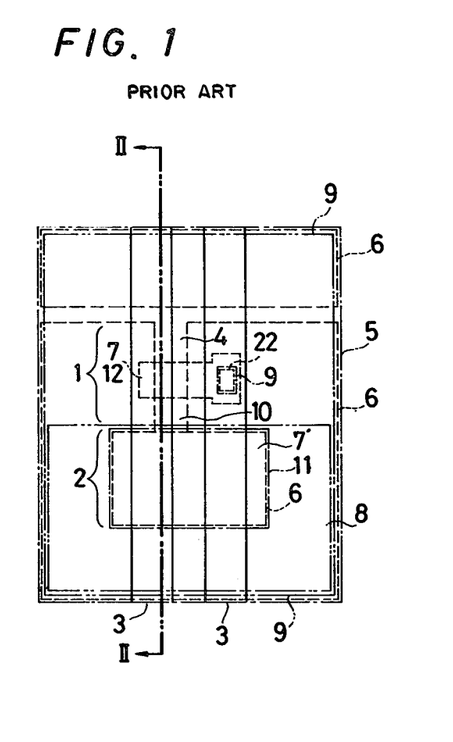
FIG. 1 is a plan view of a prior-art semiconductor memory device.
Figure 2:
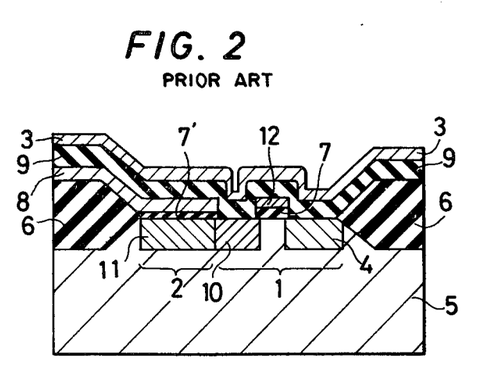
FIG. 2 is a sectional view of the device in FIG. 1 as taken along line II—II.

FIG. 1 shows a plan view of a one-transistor type MOS random access memory having hitherto been known, while FIG. 2 shows a sectional view of the device in FIG. 1 as taken along line II—II (a memory cell corresponding to one bit). This device is such that the memory cell which consists of a switching MOS transistor 1 and a storage capacitance 2 is selected by a word line (A1 lead) 3 and a data line (diffused layer) 4. In FIGS. 1 and 2, numeral 5 designates a substrate, numeral 6 an isolation oxide, numeral 7 a gate oxide film, numeral 7' an oxide film constituting the storage capacitance, numerals 8 and 12 a first layer of polycrystalline silicon (numeral 8 one electrode constituting the storage capacitance and numeral 12 a gate electrode), numeral 9 an inter-layer insulating film, numerals 4 and 10 diffused layers (a source region and a drain region, respectively), numeral 11 a diffused layer constituting the storage capacitance, and numeral 22 a contact hole.

As understood from the figures, the storage capacitance 2 is two-dimensionally arranged with the switching transistor 1 so as not to overlap each other. In the prior-art device, therefore, the area of the memory cell becomes large.

Figure 3:
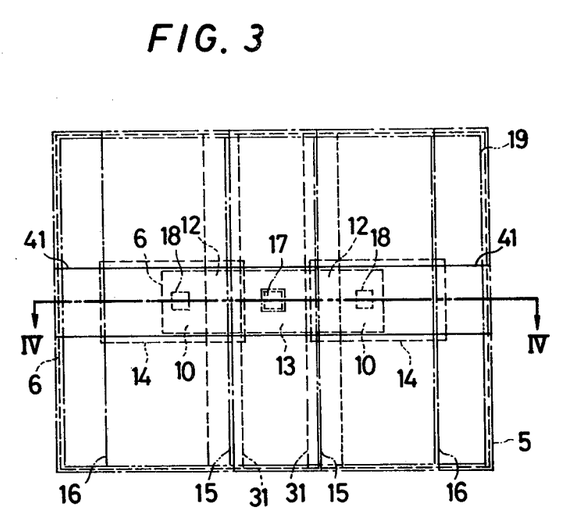
FIG. 3 is a plan view of an example of a semiconductor memory device according to this invention.
Figure 4:
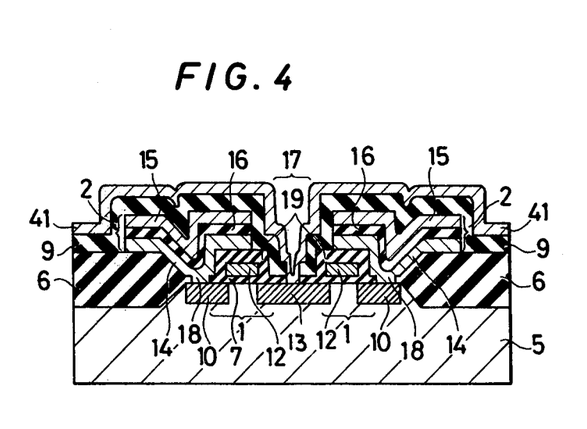
FIG. 4 is a sectional view of the device in FIG. 3 as taken along line IV—IV.

FIG. 3 shows a plan view of an example of a semiconductor memory device according to this invention, while FIG. 4 shows a sectional view of the device in FIG. 3 as taken along line IV—IV (memory cells corresponding to two bits). As seen from the figures, in the device according to this invention, at a part of a P-type silicon substrate 5 having a resistivity of 15 Ω·cm and a crystal orientation of <100>, there are provided an isolation oxide 6 having a thickness of 1.5 μm, a gate $SiO_2$ film 7 having a thickness of 800 Å, first polycrystalline silicon gate electrodes 12 having a film thickness of 3500 Å and a sheet resistance of 15 Ω/□, source and drain regions 10 and 13 having a junction depth of 1.5 μm and a sheet resistance of 10 Ω/□, and an $SiO_2$ film 19 having a thickness of 4000 Å. Subsequently, second polycrystalline silicon electrodes 14 having a film thickness of 5000 Å and a sheet resistance of 30 Ω/□ is formed so as to contact with the impurity-doped regions (diffused regions) 10 through contact holes 18. Further, an insulating film 16 and third polycrystalline silicon electrodes 15 having a film thickness of 5000 Å and a sheet resistance of 15 Ω/□ are formed, and a phosphosilicate glass layer ($P_2O_5$, 2 mole-% in concentration) 9 having a thickness of 8000 Å is deposited. Thereafter, a contact hole 17 is provided, and Al electrodes 41 are formed. The Al electrode 41 of one cell is connected in succession to the Al electrode 41 of the adjacent cells in the lateral direction, while a word line 31 which is the extension 31 of the gate electrode of said one cell is connected in succession to the extention 31 of the gate electrode of the adjacent cells in the longitudinal direction. In FIGS. 3 and 4, the second polycrystalline silicon 14, the insulating film 16 and the third polycrystalline silicon 15 constitute a storage capacitance. In this case, an $SiO_2$ film is used as the insulating film 16. Besides the $SiO_2$ film, a film of high permittivity such as $Si_3N_4$ film and $Ta_2O_5$ film or a multiple insulating layer including these films in combination is used, whereby a large storage capacitance can be obtained. Accordingly, in case where the same value as that of the storage capacitance employed in the prior-art memory cell is to be attained, the area may be smaller. By way of example, consider cases where an $SiO_2$ film, $Si_3N_4$ film and $Ta_2O_5$ film each being 800 Å thick are employed as the insulating film. Let it be supposed that the diameter of the contact hole is 2 μm, that the mask alignment tolerance is 2 μm, that the width of the polycrystalline silicon gate is 6 μm, that the width of the impurity-doped layer (diffused layer) is 6 μm, and that the storage capacitance is 0.22 pF. Then, the memory cell areas per bit are 725 $\mu m^2$, 297 $\mu m^2$ and 192 $\mu m^2$, respectively. These areas are 78%, 32% and 21% of the memory cell area 925 $\mu m^2$ of the prior-art type memory fabricated under the same design values, respectively. Although, in the above, one layer of storage capacitance has been referred to for the sake of brevity, a plurality of layers of storage capacitances can of course be provided as may be needed.

The memory cell in the present embodiment has an information written thereinto and read therefrom as stated below. After fixing the third polycrystalline silicon electrode 15 to the earth potential, a positive voltage is applied to the word line 31 made of the first polycrystalline silicon. Thus, the switching transistor 1 is rendered conductive. Subsequently, a voltage corresponding to "0" or "1" is applied to a data line 41 made of Al. Thus, charges representative of the information are stored into the storage capacitance 2. The read-out of the information is carried out by rendering the switching transistor 1 conductive and thereafter detecting the potential change of the data line 41. In the memory cell of this invention, any large diffused layer is not employed for forming the storage capacitance, and hence, any leak current based thereon does not flow. This brings forth the advantage that the storage time becomes remarkably long.

EXAMPLE 2

Figure 5:
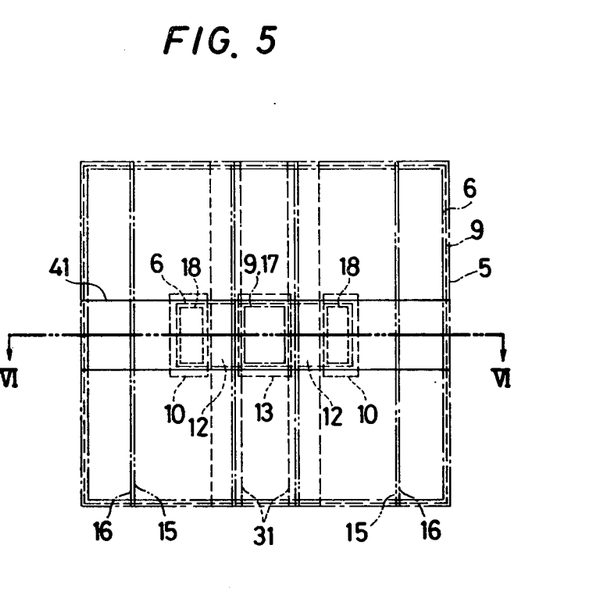
FIG. 5 is a plan view of another example of a semiconductor memory device according to this invention, for which a self-alignment technique is used.
Figure 6:
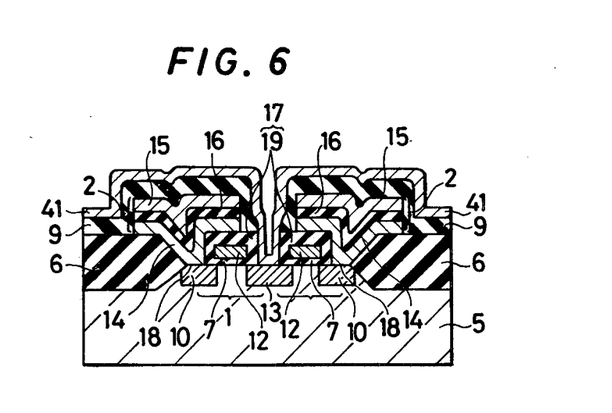
FIG. 6 is a sectional view of the device in FIG. 5 as taken along line VI—VI.

FIG. 5 is a plan view of another embodiment of this invention, while FIG. 6 is a sectional view of the device in FIG. 5 as taken along line VI—VI (memory cells corresponding to two bits). As seen from the figures, in the present embodiment, contact holes 18 and 17 for bringing impurity-doped regions (diffused regions) 10 and 13 into contact with second polycrystalline silicon electrodes 14 and Al electrodes 41 respectively are formed by the self alignment. Such formation of contact holes by the self alignment is described in detail in the specification of U.S. Patent Application Ser. No. 721,934 previously filed by the inventors.

By adopting the self-aligned contact system, the advantage owing to the performance of this invention becomes more remarkable. By way of example, when the memories of the present embodiment are fabricated by using as an insulating film 16 an $SiO_2$ film, $Si_3N_4$ film and $Ta_2O_5$ film each being 800 Å thick and on the basis of the design values mentioned previously, the memory cell areas are 675 $\mu m^2$, 270 $\mu m^2$ and 176 $\mu m^2$, respectively. These areas are 73% 29% and 19% of the memory cell area 925 $\mu m^2$ of the prior-art type memory fabricated under the same design values, respectively.

EXAMPLE 3

Figure 7:
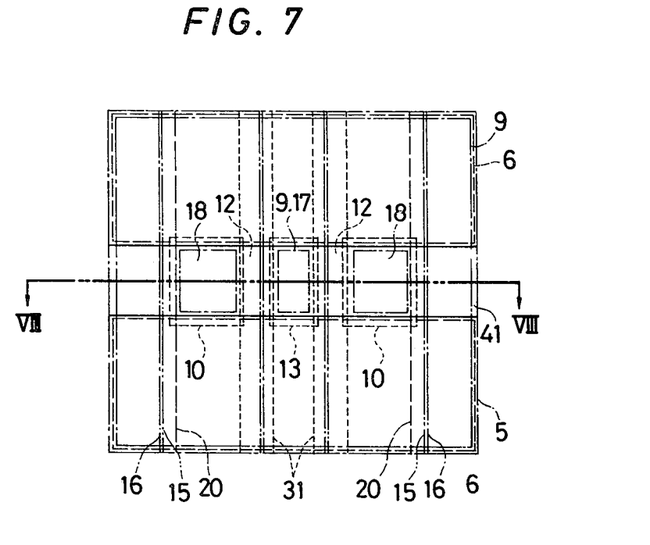
FIG. 7 is a plan view of still another example of a semiconductor memory device according to this invention based on the field shield method.
Figure 8:
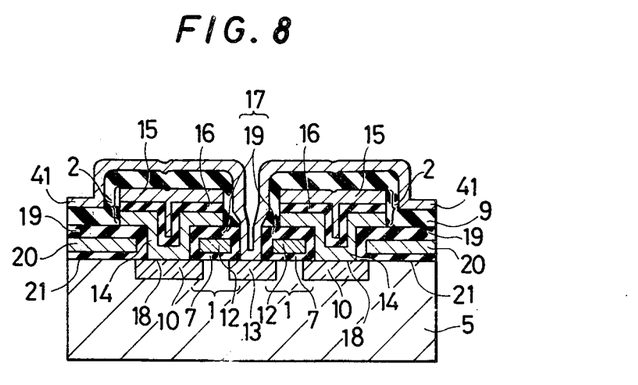
FIG. 8 is a sectional view of the device in FIG. 7 as taken along line VIII—VIII.

FIG. 7 is a plan view of still another embodiment of this invention, while FIG. 8 is a sectional view of the device in FIG. 7 as taken along line VIII—VIII (memory cells corresponding to two bits). In the present embodiment, the isolation of elements in the lateral direction in FIG. 7 (the direction of date lines) is effected in such a way that a negative voltage is applied to first polycrystalline silicone 20 formed on an $SiO_2$ film 21 being 800 Å thick (hereinbelow, this measure shall be termed the "field shield method"). The field shield method has been already described in, for example, "Shielded Silicon Gate Complementary MOS Integrated Circuit" by Hang Chang Lin, Jack L. Halsor and Paul J. Hayes, IEEE Transaction on Electron Devices Vol. 19, No. 11, pp. 1199–1207. By adopting self-aligned contacts and the field shield method, the performance of this invention becomes more remarkably advantageous, i.e. changes in the diameter of a contact hole attributed to the lateral oxidation (bird beaks) as occurs in case of forming isolation oxide by the local oxidation, and leak currents due to, for example, a crystal defect at an end of the isolation oxide diminish, and also the self-aligned contact system is facilitated. The point of the memory cell area is substantially the same as in the case of FIGS. 5 and 6. In the embodiments of FIGS. 3 to 8, the second polycrystalline silicon 14, the insulating film 16 and the third polycrystalline silicon 15 which constitute the storage capacitance 2 can be worked without requiring any mask alignment tolerance by the self-aligned etching.

EXAMPLE 4

Figure 9:
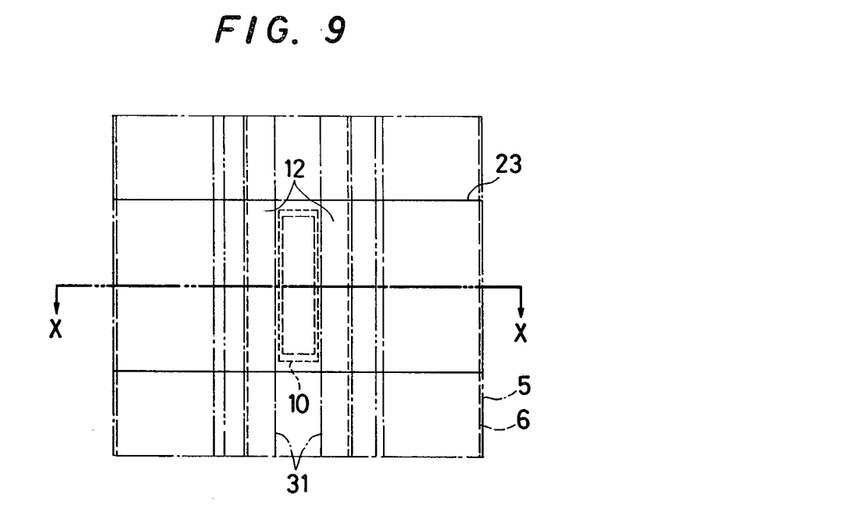
FIG. 9 is a plan view of an example of a semiconductor memory device according to this invention, where a storage capacitance is formed between data line and a source electrode.
Figure 10:
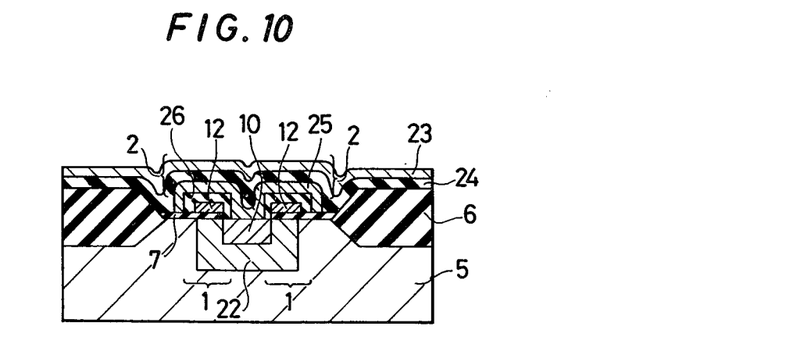
FIG. 10 is a sectional view of the device in FIG. 9 as taken along line X—X.

FIG. 9 is a plan view of a further embodiment of this invention, while FIG. 10 is a sectional view of the device in FIG. 9 as taken along line X—X (memory cells corresponding to two bits). In the present embodiment, an impurity-doped region 22 having the opposite conductivity type to that of a substrate 5 is provided in the substrate, and an impurity-doped region 10 having the same conductivity type as that of the substrate is provided within the impurity-doped region 22. The substrate 5 serves as a common source, and the impurity-doped region 10 as a drain. They form switching transistors 1 along with gates 12 which are provided so as to oppose to the impurity-doped region 22 through a gate insulating film 7. An electrode 25 is provided in direct contact with the drain 10 of the switching transistor 1. A counter electrode 23 serving also as a data line overlies the electrode 25 with an insulating film 24 interposed therebetween. Here, the electrodes 25 and 23 and the insulating film 24 constitute a storage capacitance 2.

Figure 11:
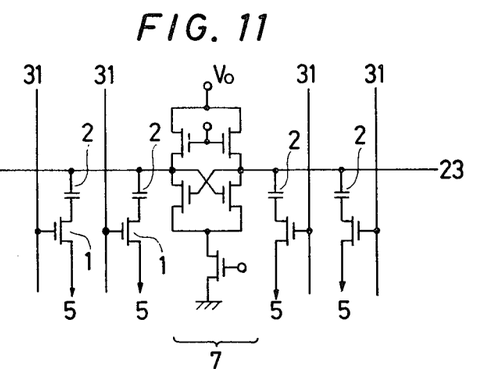
FIG. 11 is a circuit diagram of the device illustrated in FIGS. 9 and 10.
Figure 12:
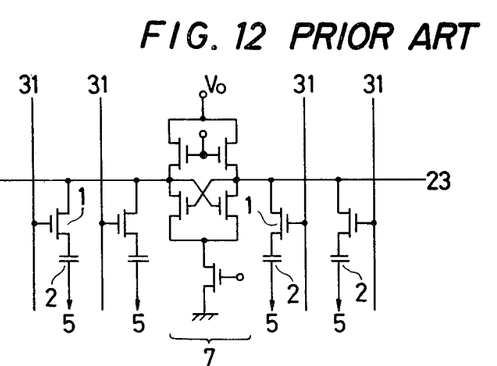
FIG. 12 is a circuit diagram of the prior art device illustrated in FIGS. 1 and 2.

A circuit diagram of this embodiment is represented as in FIG. 11, which will now be compared with a circuit diagram of FIG. 12 corresponding to the device illustrated in FIG. 1. The two circuits are different in that the storage capacitance 2 is incorporated into the source of the switching transistor 1 in FIG. 12, whereas it is situated between the drain and the data line 23 in FIG. 11. In the figures, numeral 7 indicates an amplifier.

In this embodiment, the storage capacitance 2 can be three-dimensionally stacked over the switching transistor 1. Moreover, both the storage capacitance 2 and the switching transistor 1 can be formed by the self-alignment. Therefore, the memory cell area per bit can be conspicuously reduced. Assuming by way of example that the diameter of a contact hole is 2 $\mu$m, that the mask alignment tolerance is 1 $\mu$m, that the width of the polycrystalline silicon gate is 2 $\mu$m, that the width of the diffused layer is 3 $\mu$m, that the interval of the elements is 2 $\mu$m, that the thickness of the gate oxide film is 1000 Å, that the thickness of the insulating film (thermal oxidation film) between the first layer of polycrystalline silicon and the second layer of polycrystalline silicon is 500 Å, and that the storage capacitance is 0.04 pF, then the memory cell area per bit is 100 $\mu$m$^2$. This area is about 40% of the memory cell area 247 $\mu$m$^2$ of the prior-art type memory fabricated under the same design values. In the embodiment of FIGS. 9 and 10, the substrate 5 is an N-type silicon substrate having a resistivity of 3 $\Omega\cdot$ cm. Further, the thickness of an oxide film for isolation 6 is 1 $\mu$m, that of the gate oxide film 7 is 1000 Å, those of the polycrystalline silicon layers 12 and 25 are 3500 Å, and that of the Al electrode 23 is 6000 Å. Inter-layer insulators 24 and 26 are a thermal oxidation film 500 Å thick and a phosphosilicate glass film 3000 Å thick, respectively.

EXAMPLE 5

Figure 13:
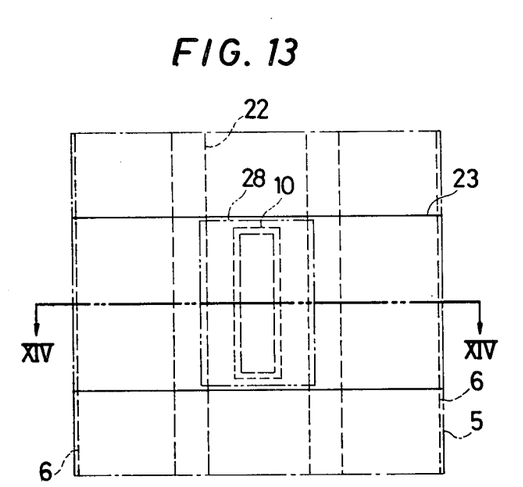
FIG. 13 is a plan view of another example of a semiconductor memory device according to this invention, where a storage capacitance is formed between a data line and a source-gate electrode.
Figure 14:
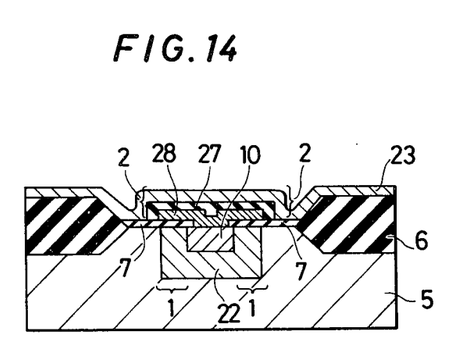
FIG. 14 is a sectional view of the device in FIG. 13 as taken along line XIV—XIV.
Figure 15:
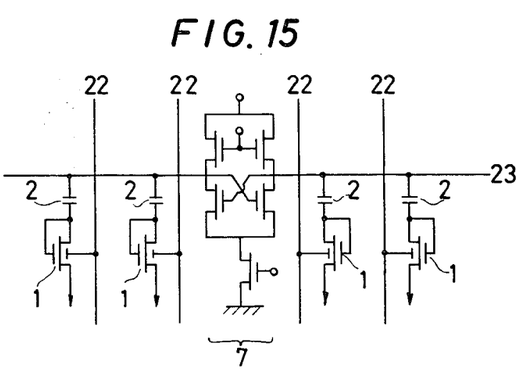
FIG. 15 is a circuit diagram of the device illustrated in FIGS. 13 and 14.

FIG. 13 shows a plan view of a still further embodiment of this invention, while FIG. 14 shows a sectional view of the device in FIG. 13 as taken along line XIV—XIV. In the present embodiment, as illustrated in the figures, impurities such as boron and phosphorus are diffused or ion-implanted through a window provided in a gate oxide film 7, thereby to form regions 22 and 10 at a part of an N-type silicon substrate 5. Thereafter, a polycrystalline silicon electrode 28 is formed. Here, the polycrystalline silicon electrode 28 functions as the gate electrode and drain electrode of a switching transistor 1 and also serves as one electrode of a storage capacitance. An insulating film 27 and a counter electrode 23 for building up the storage capacitance are formed over the polycrystalline silicon electrode 28. Thus, the storage capacitance can be three-dimensionally stacked over the switching transistor. In addition, both the storage capacitance and the switching transistor can be formed by the self-alignment. In case where the semiconductor memory device of the present embodiment is fabricated by employing the design values mentioned previously, the memory cell area per bit is 64 $\mu$m$^2$, which is about 33% of the memory cell area 195 $\mu$m$^2$ of the prior-art type memory fabricated under the same design values (provided that the storage capacitance shall be 0.024 pF). A memory array portion and an amplifier portion 7 in this case are illustrated by an electric circuit diagram in FIG. 15. As seen from the figure, the gate of the switching transistor 1 is connected with the drain thereof, and the switching is effected by the back gate with the impurity-doped region 22.

As explained above, according to this invention, the storage capacitance is provided so as to overlap over the switching transistor. Therefore, the memory cell area can be conspicuously smaller than in the prior-art semiconductor memory, and the density of integration of the semiconductor memory can be sharply enhanced. Further, the semiconductor memory device according to this invention is free from the leak current flowing between the substrate and the diffused layer provided for forming the storage capacitance as in the one-transistor type MOS memory disclosed in U.S. Pat. No. 3,387,286. Advantageously, therefore, the storage time becomes remarkably long.

What is claimed is:
1. A semiconductor memory device comprising:
   a semiconductor substrate;
   a plurality of memory cells arranged in matrix form on one surface of said semiconductor substrate, each of said memory cells comprising:
   a source region, a gate region, and a drain region, which are provided in a surface portion of said semiconductor substrate,
   a gate insulating film provided on the gate region,
   a first conductive substrate provided opposite said gate region on the gate insulating film to serve as a gate electrode,
   a first insulating film disposed on said first conductive substance, and
   at least one storage capacitance unit comprising a second conductive substance which is in contact with either said source region or said drain region, a part of said second conductive substance being superimposed on said first conductive substance through said first insulating film,
   a second insulating film provided on said second conductive substance, and
   a third conductive substance provided on said second insulating film;
   a third insulating film disposed on said memory cells;
   a data line disposed on said third insulating film and connecting in succession through a contact hole formed through said third insulating film either the source region or the drain region which is not in contact with said second conductive substance, with the corresponding source or drain region of adjacent memory cells belonging to the same column; and
   a word line connecting said first conductive substance in succession with the corresponding region of adjacent memory cells belonging to the same row.
2. A semiconductor memory device according to claim 1, wherein said either of said source region and said drain region in contact with said data line is common to a pair of adjacent memory cells belonging to said data line.
3. A semiconductor memory device according to claim 1, wherein said pair of memory cells belonging to said data line are isolated from one another by a polycrystalline silicon layer which is provided on the substrate through an insulating film and to which a voltage is applied, and memory cells belonging to a word line are isolated by a thick insulating film which is provided on the substrate surface.

* * * * *